United States Patent [19]
Gal

[11] Patent Number: 4,613,771
[45] Date of Patent: Sep. 23, 1986

[54] INTEGRATED CIRCUIT HAVING THREE POWER BASES AND PROPORTIONED PARASITIC RESISTIVE AND CAPACITIVE COUPLING TO REDUCE OUTPUT NOISE

[75] Inventor: Laszlo V. Gal, Poway, Calif.

[73] Assignee: Burroughs Corporation, Detroit, Mich.

[21] Appl. No.: 601,532

[22] Filed: Apr. 18, 1984

[51] Int. Cl.[4] ............... H03K 19/003; H03K 19/086; H03K 19/094; H03K 19/20
[52] U.S. Cl. ............................ 307/443; 307/200 A; 307/200 B; 307/448; 307/455; 307/542
[58] Field of Search ............. 307/442, 443, 454, 455, 307/448, 467, 254, 270, 572, 491, 542, 543, 200 A, 200 B

[56] References Cited

U.S. PATENT DOCUMENTS

| | | | |
|---|---|---|---|
| 3,909,636 | 9/1975 | Masaki | 307/443 X |
| 4,085,432 | 4/1978 | Varettoni | 357/13 X |
| 4,278,897 | 7/1981 | Ohno et al. | 307/455 |
| 4,347,446 | 8/1982 | Price | 307/443 |
| 4,398,106 | 8/1983 | Davidson et al. | 307/200 A |
| 4,445,051 | 4/1984 | Elmasry | 307/450 |
| 4,553,049 | 11/1985 | Cha et al. | 307/467 X |

Primary Examiner—Larry N. Anagnos
Attorney, Agent, or Firm—Charles J. Fassbender; Kevin R. Peterson

[57] ABSTRACT

A circuit integrated into a substrate and having improved noise immunity comprises logic gates for receiving and switching current from a first bus to produce a logic signal; a resistor for receiving and passing a small bias current from a second bus indicating the state of the logic signal; a transistor for receiving and passing a large drive current from a third bus in response to bias current; and the first bus has a relatively large parasitic coupling serially through the logic gates, substrate, and resistors to the second bus; while the first bus has a relatively small parasitic coupling serially through the logic gates, substrate, and transistor to the third bus.

11 Claims, 10 Drawing Figures eg. 1 ~ $\Delta V_2 \simeq \Delta V_1 \left[\dfrac{Z_2}{Z_1+Z_2}\right]$ eg. 2 ~ $\Delta V_3 \simeq \Delta V_2 \left[\dfrac{Z_4}{Z_3+Z_4}\right]$ eg. 3 ~ $Z_3 \simeq 10 Z_1$ eg. 4 ~ $\Delta V_3 \simeq \Delta V_2 \left[\dfrac{Z_4}{10Z_1+Z_4}\right]$ eg. 5 ~ $Z_1 > Z_4$ eg. 6 ~ $\Delta V_3 \simeq \Delta V_2 \left[\dfrac{Z_4}{10Z_1}\right]$ eg. 7 ~ $\Delta V_3 < \dfrac{\Delta V_2}{10}$

INTEGRATED CIRCUIT HAVING THREE POWER BASES AND PROPORTIONED PARASITIC RESISTIVE AND CAPACITIVE COUPLING TO REDUCE OUTPUT NOISE

BACKGROUND OF THE INVENTION

This invention relates to integrated circuits and more particularly it relates to such circuits which include provisions for noise immunity.

In any integrated circuit, various input signals are sent through input pads to the circuit. There, the circuit processes the input signals and generates output signals which are sent off of the circuit through output pads. However, each of the output pads has associated with it a small but non zero parasitic inductance; and thus a noise spike is generated in the circuit when the magnitude of the current through the output pads switches.

This noise spike is then parasitically coupled to other parts of the circuit where no switching is supposed to occur. That is, various parasitic capacitances and resistances in the circuit will couple the noise on the output pads to other portions of the circuit, and there the noise can cause a problem. For example, if the noise is coupled to the base of a transistor which drives an output pad and which is not supposed to be switching (e.g., a quiet driver), then that quiet driver will respond to the noise on its base by generating an even larger current noise spike on its output due to the large $\beta$ of the transistor. This in turn can cause errors in the system in which the integrated circuit is used.

In the prior art, one way of coping with switching noise was to construct the output drivers such that they switched at a relatively slow speed. In other words, the speed at which the output drivers operated was intentionally slowed down. This in turn reduced the magnitude of noise that was generated on the output pads since that noise is proportional to the parasitic inductance of the pins times and magnitude of the current that switches divided by the time interval in which the current switches. However, this solution is undesirable because it severely limits the maximum speed at which the circuitry operates.

Accordingly, a primary object of the invention is to provide an integrated circuit having improved noise immunity.

Another object of the invention is to provide an integrated circuit having high noise immunity plus high switching speeds.

BRIEF SUMMARY OF THE INVENTION

In accordance with the invention, a circuit integrated into a substrate and having improved noise immunity comprises:

a plurality of logic gates that switch internal currents to perform respective logic functions and which are intercoupled together in a predetermined fashion to produce logic signals;

a plurality of output drivers, each of which is coupled to receive at least one of the logic signals and includes a resistor for passing a small bias current indicating the state of the received signals and also includes a transistor coupled to the resistor for passing a large drive current in response to the bias current;

the logic gates, resistors, and transistors are parasitically coupled together through the substrate; and a first power bus is coupled to the transistor for supplying the drive current thereto, a second power bus separate from the first power bus is coupled to the logic gate for supplying the internal currents thereto, and a third power bus separate from the first and second power bus is coupled to the resistor for supplying the bias current thereto.

Preferably, the parasitic coupling from the third power bus through the resistors and the substrate and the logic gates to the second power bus is less than one-fifth the parasitic coupling from the first power bus through transistors and the substrate and the logic gates to the second power bus. Also preferably, the resistors and transistors occupy respective areas of the substrate having a ratio of less than one to five, while the logic gates and transistors occupy respective areas of the substrate having a ratio of at least five to one.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
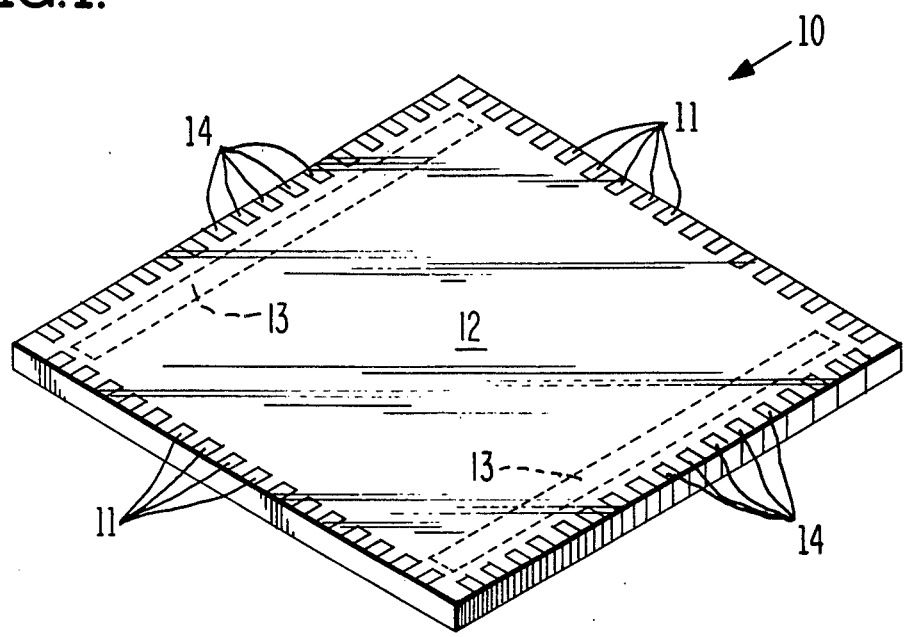
FIG. 1 illustrates an integrated circuit die which incorporates the invention.

In FIG. 1, reference numeral 10 indicates an integrated circuit die that is constructed according to the invention. Input signals to die 10 are received on a plurality of input pads 11 which are disposed along two edges of the die. Those input signals are then processed by a plurality (e.g., hundreds or thousands) of logic gates 12 that are disposed throughout the central portion of the die 10. Signals from the logic gates 12 are sent to output drivers 13 which are disposed along the periphery of the die, and signals from the output drivers 13 are sent to output pads 14 which lie alongside the output drivers. Suitably, the total number of pads 11 and pads 14 is relatively large such as between sixty and two hundred.

Each pad 11 and 14 has an accompanying parasitic inductance which is small but which is not zero. Further, when die 10 is placed in a package so that it can be connected to other die, the parasitic inductance that accompanies each pad 11 and 14 increases. For example, the typical parasitic inductance of a pin on an IC package is two nanohenrys, of a conductive trace on an IC package is three nanohenrys, and of pad 11 or 14 itself is one nanohenry. Due to such inductance, a voltage noise spike is induced in die 10 when several of the signals on the output pads 14 switch simultaneously. Without the present invention, this noise spike is coupled to other output pads 14 on die 10 which are not switching; whereas with the present invention, such coupling of the switching noise is substantially reduced.

Figure 2:
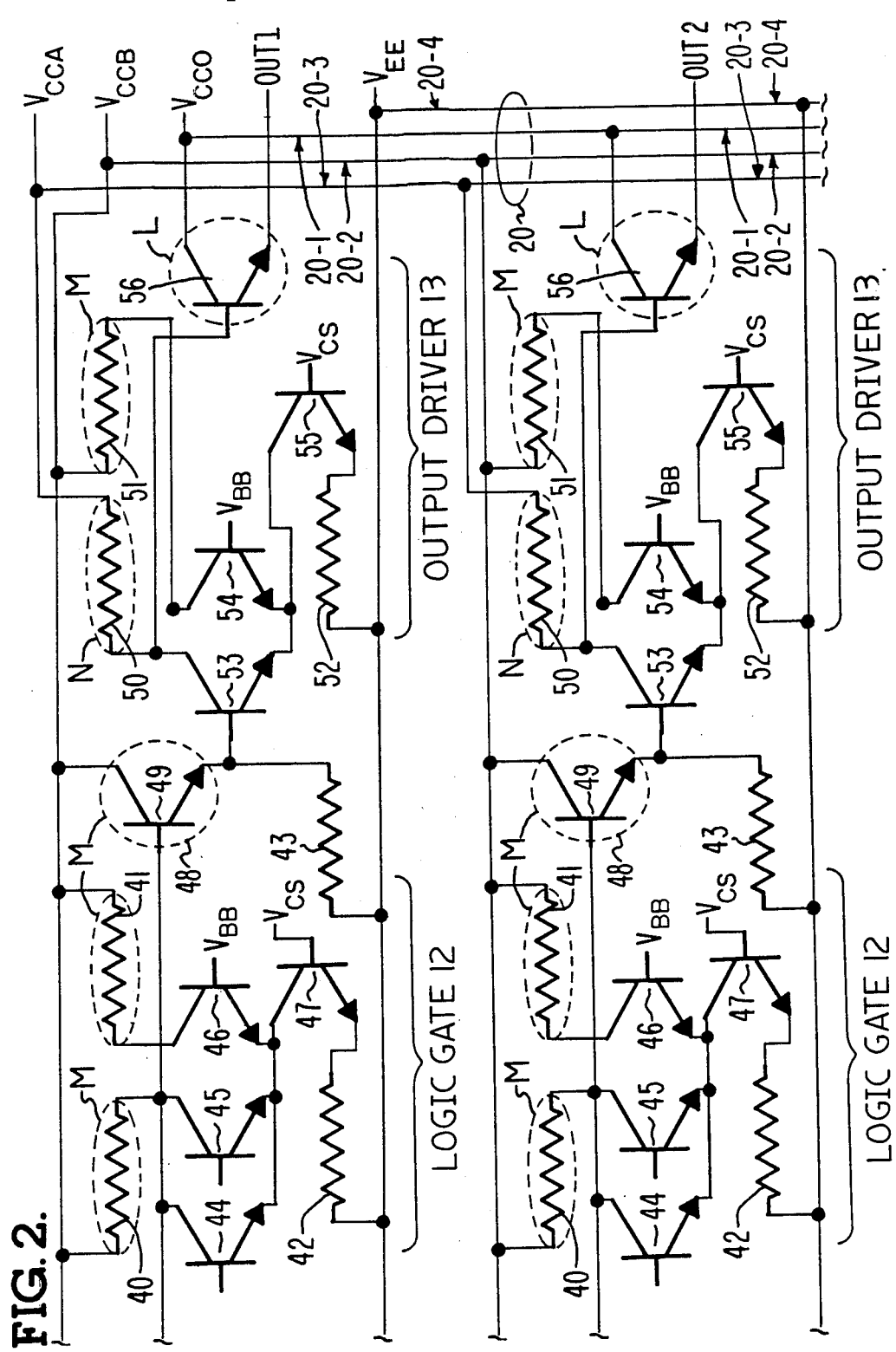
FIG. 2 is a detailed circuit diagram of the circuitry which is on the die of FIG. 1.

To understand how the invention reduces switching noise, reference should now be made to FIG. 2. It includes a detailed circuit diagram of the logic gates 12 and a detailed circuit diagram of the output drivers 13. Also included is a detailed circuit diagram of the power buses 20 which interconnect and supply operating currents to the logic gates 12 and output drivers 13.

Logic gate 12 includes resistors 40 through 43 and transistors 44 through 47 which are interconnected as illustrated. In operation, respective input signals are received on the base of transistors 44 and 45. If both input signals are low, then current passes through resistor 40 into transistor 48 to produce a high output voltage at that transistor's emitter. Conversely, if the input signal to transistor 44 (or transistor 45) is high, then current from resistor 40 is directed through transistor 44 (or transistor 45) which forces the voltage on the emitter of transistor 48 low.

Output driver 13 includes resistors 50 through 52 and transistors 53 through 56 which are interconnected as illustrated. In operation, if the input signal to the base of transistor 53 is high, then a small current passes through resistor 50 and transistor 53 which biases trnasistor 56 off. Conversely, if the input signal to a transistor 53 is low, then the small bias current passes through resistor 50 to a large output driver transistor 56 which in turn passes a large output current to an output pad.

Also as FIG. 2 illustrates, all of the current which output driver transistor 56 passes is supplied by a separate power bus 20-1. Likewise, the current which all of the logic gates 12 internally switch is supplied by another separate power bus 20-2. Further, all of the current which resistor 50 passes is supplied by still another separate power bus 20-3. These power buses are separate even though the voltages Vcco, Vcca, and Vccb which are on them (as generated by power supplies external to die 10) are the same. A fourth bus 20-4 serves as a common reference for the voltages on buses 20-1, 20-2, and 20-3.

Figure 3:
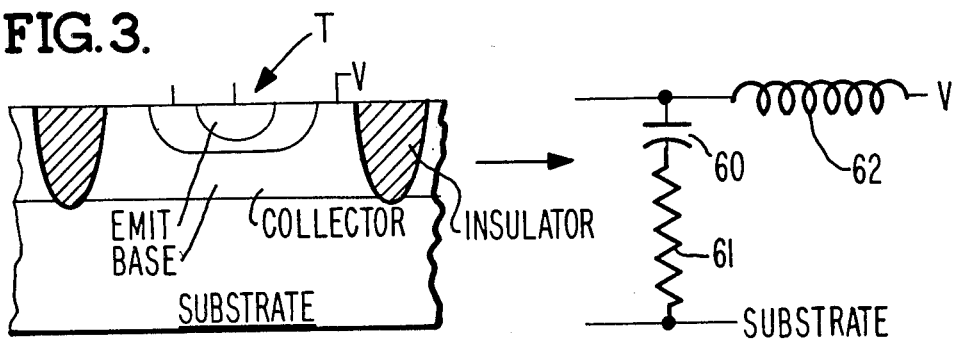
FIG. 3 is a cross section of the physical layout of a transistor in FIG. 2 along with an equivalent circuit for the parasitic coupling of that transistor to the substrate.

To appreciate the significance of the above described bus structure, one must first understand the parasitic couplings that the FIG. 2 circuit has. For that, reference should be made to FIGS. 3, 4, and 5. FIG. 3 shows a cross-sectional view of the physical structure of a transistor T. Transistor T may be any of the above described transistors 44 through 48 and 53 through 56. Transistor T is constructed in a conventional fashion in that it is bordered on its sides by an insulation region or a reverse biased junction; it has a collector region which lies on a substrate; it has a base region which lies within the collector region; and an emitter region which lies within the base region. Each of these regions is labeled in FIG. 3.

Also shown in FIG. 3 is an equivalent circuit of the electrical path from the substrate to the power bus that connects to the transistor's collector. This equivalent circuit includes a capacitor 60 and a resistor 61. Capacitor 60 arises primarily due to the PN junction between the collector and the substrate; while resistor 61 arises due to the resistance in the collector and the resistance of that portion of the substrate that lies below the collector. Thus, the magnitude of the capacitor 60 varies directly with the area of the collector-substrate junction; while the magnitude of resistor 61 varies inversely with the magnitude of that junction. An inductor 62 is also included in the equivalent circuit of FIG. 3, and it represents the parasitic inductance of the voltage bus and the associated inductance of the portion of the die package that couples to the collector pad.

Figure 4:
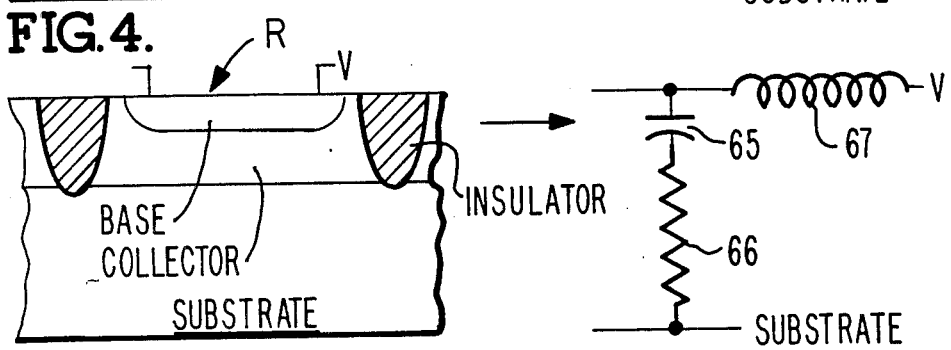
FIG. 4 is a cross section of the physical layout of a resistor in FIG. 2 along with an equivalent circuit for the parasitic coupling of that resistor to the substrate.

FIG. 4, by comparison, shows a cross-sectional view of the physical structure of a resistor R. Resistor R may be any of the above described resistors 40 through 43 and 50 through 52. Resistor R has the same structure as transistor FIG. 3 except that the emitter is omitted and the input and output terminals of the resistor are connected to the base region.

Also shown in FIG. 4 is the equivalent circuit of the electrical path from the substrate to the power bus that connects to the resistor. This equivalent circuit includes a capacitor 65, and a resistor 66. Capacitor 65 arises primarily due to the PN junction capacitance between the base and collector and another PN junction capacitance between the collector and the substrate. These capacitors are in series. Resistor 66 arises due to the resistance of the base region, the collector region, and the portion of the substrate that lies below the collector.

Figure 5:
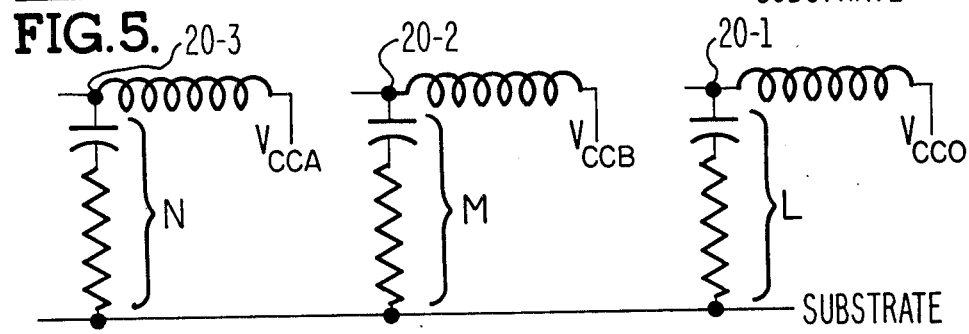
FIG. 5 is a circuit diagram showing the parasitic coupling of three separate power buses in Figure 2 to the substrate.

Utilizing the equivalent circuits of FIGS. 3 and 4, another equivalent circuit diagram can be drawn which shows how the power buses 20-1, 20-2, and 20-3 are parasitically intercoupled. Such a diagram is shown in FIG. 5. There the components labeled "L" represent the parasitic coupling of voltage bus 20-1 through all of the output driver transistors 56 to the substrate; the circuit components labeled "M" represent the parasitic coupling of power bus 20-2 through transistor 48 and resistors 40, 41, and 51 in the logic gates 12 and output drivers 13 to the substrate; and the components labeled "N" represent the parasitic coupling of voltage bus 20-3 through all of the bias resistors 50 to the substrate.

Approximate relative magnitudes can also be assigned to the value of the components L, M, and N by considering the area which those components occupy and recalling that the magnitude of the capacitance is proportional to the components' area while the magnitude of the resistance is inversely proportional to the components' area. Inspection of FIG. 1 shows that components M will occupy the largest area since they are spread throughout the entire interior portion of die 10. Components L and N, by comparison, have much smaller areas since they only exist on the perimeter of the die.

Figure 6:
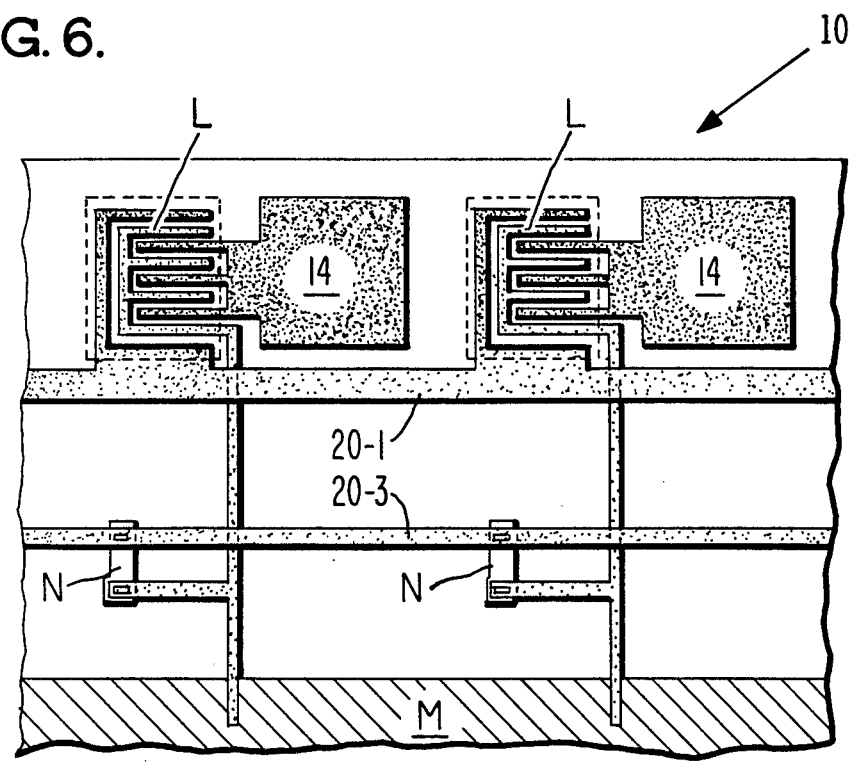
FIG. 6 shows a plan view of some key circuit components of FIG. 2.

Further, by inspection of FIG. 6, the approximate magnitudes of components L and N relative to each other can be determined. FIG. 6 is a detailed plysical layout of the L components (i.e., transistors 56) and the N components (i.e., resistors 50). This figure shows that the transistors L occupy approximately ten times the area of the resistors N. Such a large area for the transistors L is required because a small emitter resistance and small collector resistance is required for the transistor to drive a fifty ohm load (which is a standard load); and the resistance of the collector and emitter is inversely proportional to their size.

Figure 7:
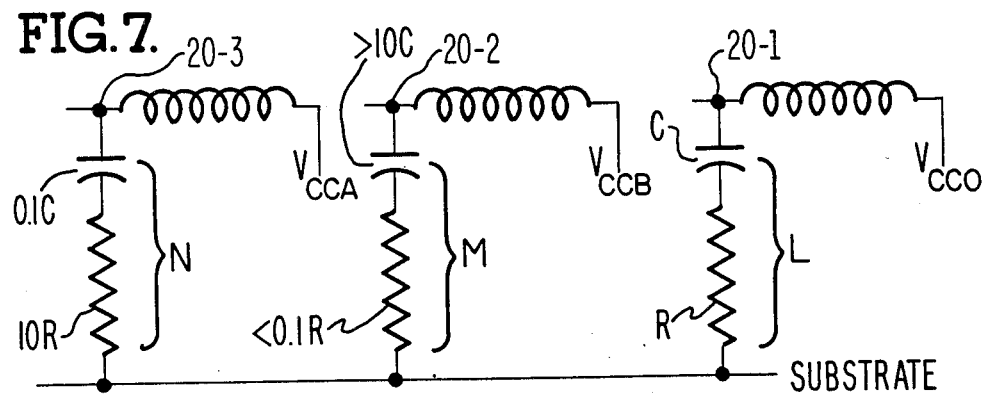
FIG. 7 is an enhancement of FIG. 5 which includes relative magnitudes for the parasitic components.

Suppose now that the parasitic capacitance of the transistors L to the substrate has a value C and the parasitic resistance of the transistors L to the substrate has a value R. Then, due to the fact that the resistors N occupy only one-tenth the area of the transistors L, the parasitic capacitance of the resistors N to the substrate can be expressed as 0.1C, and the parasitic resistance of the resistors N to the substrate can be expressed as 10R. This is illustrated in FIG. 7. Likewise, since the components M occupy substantially more space than the transistors L, the parasitic capacitance of the components M to the substrate can be expressed as >10C and their parasitic resistance to the substrate can be expressed as <0.1R. This also is illustrated in FIG. 7.

Figures 8, 9:
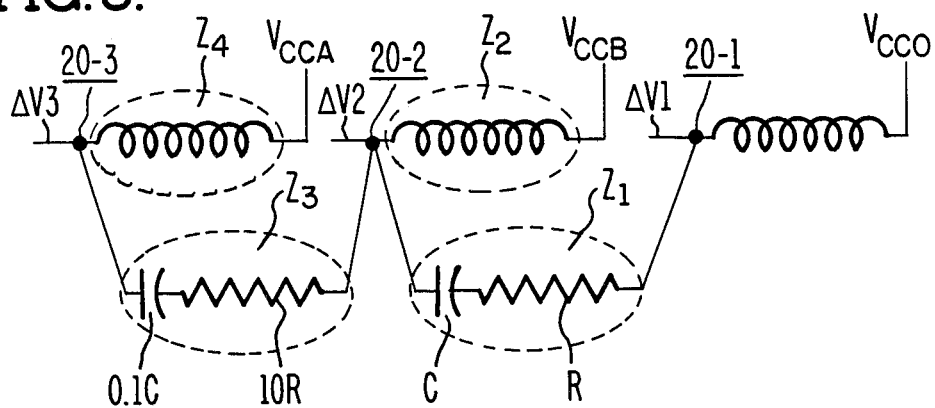
FIG. 8 is a simplification of the circuit of FIG. 7.
FIG. 9 is a set of equations showing the relative magnitudes of the noise that is induced on the three separate buses of FIG. 2.

Utilizing the relative magnitudes of the components L, M, and N of FIG. 7, that figure can be further simplified as shown in FIG. 8. When a signal passes from bus 20-1 through the components L and M to bus 20-2, it passes in series through a capacitor C, a resistor R, another resistor of less than 0.1R, and another capacitor greater than 10C. Thus, the equivalent series resistance encountered is approximately R, and the equivalent series capacitance encountered is approximately C. Such an equivalent coupling between buses 20-1 and 20-2 is illustrated in FIG. 8.

Likewise, as a signal passes from bus 20-2 through components M and N to bus 20-3, it passes in series through a capacitor of greater than 10C, a resistor of less than 0.1R, another resistor of about 10R, and another capacitor of about 0.1C. Thus, the equivalent series resistance of this path is about 10R and the equivalent series capacitance of this path is about 0.1C. This also is illustrated in FIG. 8.

By inspection of FIG. 8, it can be seen that if a voltage spike $\Delta V1$ is induced on voltage bus 20-1, then that voltage spike will be parasitically coupled through the resistance R and capacitance C to bus 20-2. Equation 1 of FIG. 9 gives a mathematical expression of the voltage $\Delta V2$ which is induced on bus 20-2 as being approximately equal to the voltage spike $\Delta V1$ on bus 20-1 times Z2 divided by the quantity Z1+Z2. In this expression, Z1 is the series impedance of resistance R and capacitance C, while impedance Z2 is due to the parasitic inductance of power bus 20-2.

Likewise, voltage spike $\Delta V2$ on bus 20-2 is parasitically coupled through the resistance 10R and capacitance 0.1C to bus 20-3. Equation 2 of FIG. 9 expresses the induced voltage $\Delta V3$ on bus 20-3 as being approximately equal to the voltage $\Delta V2$ times an impedance Z4 divided by the quantity Z3+Z4. In this expression, Z3 is the series impedance of resistance 10R and capacitance 0.1C, and impedance Z4 is due to the parasitic inductance of power bus 20-3.

Inspection of FIG. 8 shows that impedance Z3 is approximately ten times impedance Z1. This is expressed in equation 3. Substitution of equation 3 into equation 2 yields equation 4. Further, impedance Z1 (which includes the parasitic impedance of all of the transistors L) is much larger than impedance Z4 (which is only due to the parasitic inductance of power bus 20-3). Equation 5 states the relative values of impedances Z1 and Z4.

Utilizing equation 5, equation 4 can be rewritten as equation 6 in which the term Z4 in the denominator is dropped. Equation 6 contains the ratio of Z4 divided by Z1; but due to equation 5, that ratio is less than one. Thus, equation 6 can be rewritten as equation 7 which states that the noise spike $\Delta V3$ that is induced on bus 20-3 will be less than one-tenth the magnitude of noise spike $\Delta V2$ on bus 20-2.

Referring now back to the circuit of FIG. 2, the significance of equation 7 can be seen. In that circuit, suppose that several (e.g., ten) output transistors A in respective output drivers 13 simultaneously switch from off to on while the remaining output transistors A (the quiet transistors) do not switch. Due to the switching transistors and parasitic inductance of bus 20-1, a negative voltage spike $\Delta V1$ will be induced on bus 20-1.

Voltage spike $\Delta V1$ will be coupled from bus 20-1 through the transistors L and components M to bus 20-2. There, the induced voltage spike will have magnitude $\Delta V2$. In turn, voltage spike $\Delta V2$ will be coupled through the components M and the resistors N to produce a spike $\Delta V3$ on bus 20-3. However, equation 7 says that noise spike $\Delta V3$ will be less than one-tenth the magnitude of noise spike $\Delta V2$.

That ten-to-one attenuation is important because noise on bus 20-3 is coupled through resistors N directly into the base of the transistors L. And any change in voltage on the base of the transistors L directly affects the degree to which those transistors conduct. In other words, the output transistors L have essentially no immunity to noise on their base. Thus, any small noise spike on the base of the transistors L will adversely produce a much larger noise spike on the output of the quiet transistors.

Figure 10:
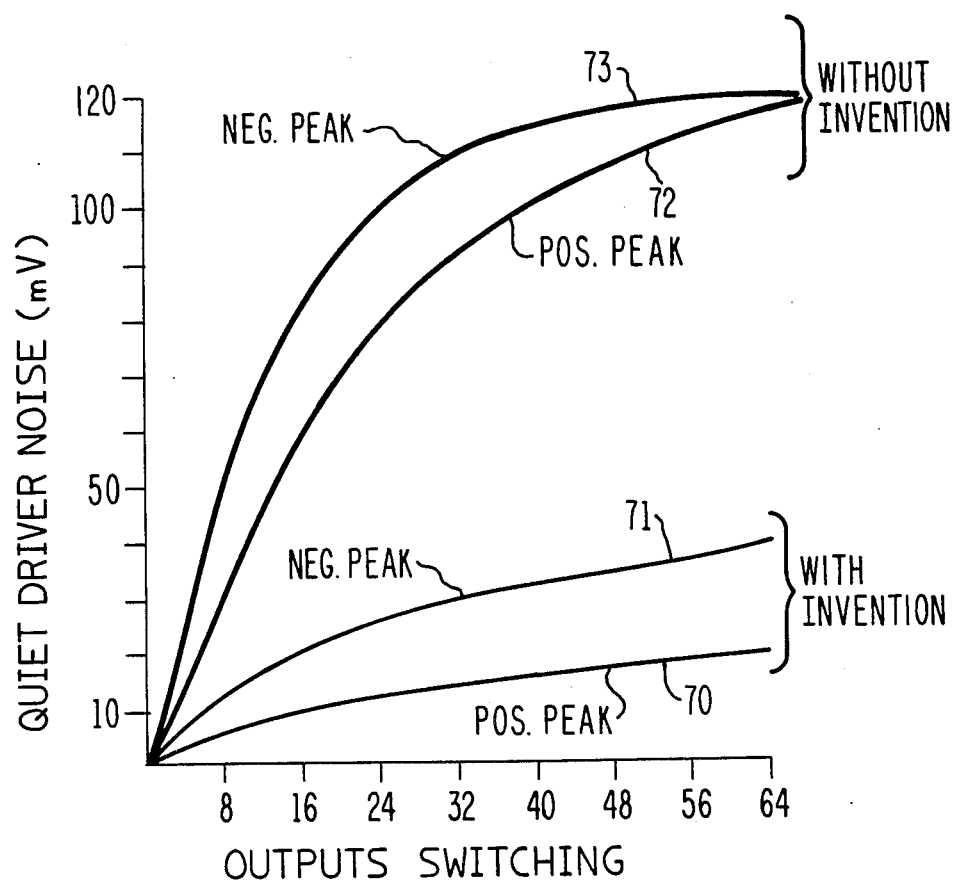
FIG. 10 is a set of curves which are generated from a computer simulation of the circuit of FIG. 2 and which verify the equations of FIG. 9.

To verify the above described reduction in switching noise, a computer simulation of the circuit of FIG. 2 was run. In this simulation, the circuit was physically laid out on a die as shown in FIGS. 1 and 6. A publicly available SPICE computer program was utilized to perform the simulation. Various parameters that were used in this simulation are listed below.

ratio of area of transistors L 10:1 to area of bias resistors N:

ratio of area of logic gates M 100:1 to area of transistors L:

parasitic capacitance 320 picofarads of transistors L to substrate:

parasitic resistance 5 ohms transistors L to substrate:

parasitic capacitance of 5000 picofarads components M to substrate:

parasitic resistance of 0.3 ohms components M to substrate:

parasitic capacitance of 32 picofarads resistors N to substrate:

parasitic resistance of 50 ohms resistors N to substrate:

Results of the SPICE computer simulation are shown in FIG. 10. There, the number of transistors A that simultaneously switch is plotted on the horizontal axis, while the switching noise that is induced on the base of the remaining quiet transistors is plotted in millivolts on the vertical axis. A curve 70 shows the positive voltage that is induced on the base of the quiet transistors L when the switching transistors L turn off, whereas a curve 71 shows the negative noise voltage that is induced on the base of the quiet transistors when the switching transistors turn on.

Also simulated by this SPICE program was the operation of a modified FIG. 2 circuit in which a separate voltage bus 20-2 is eliminated and the resistors N are connected directly to voltage bus 20-3. In this simulation, all of the above listed parameters remained unchanged. Results of this simulation are shown via curves 72 and 73. Specifically, curve 72 shows the peak positive noise that is induced at the base of the quiet transistors L; while curve 73 shows the peak negative voltage that is induced on the base of the quiet transistors L.

Comparing curve 70 to curve 72, it can be seen that the reduction in switching noise which is achieved by the present invention is substantial. For example, when twenty-four of the transistors L simultaneously switch off, the induced noise on the base of the quiet drivers is only about 10 millivolts if the present invention is incorporated; whereas the induced noise is over 70 millivolts without the invention. Comparing curve 71 and 73 shows that a similar reduction in noise is achieved when several of the output transistors L simultaneously switch on.

Note that the above computer simulation curves 70–73 show that a ten-to-one improvement in noise was not achieved even though a ten-to-one ratio was used for the area of output transistors L and bias resistors N. Rather, the improvement in noise was about seven-to-one. This discrepancy is explained by the fact that SPICE simulation is more exact than the approximate analysis of equations 1–7.

One preferred embodiment of the invention has now been described in detail. In addition, however, many changes and modifications can be made to these details without departing from the nature and spirit of the invention. For example, from the above description it should be clear that the exact makeup of the logic gates 12 is unimportant. For example, logic gate 12 can be a NAND gate, a NOR gate, and AND gate, or an OR gate. Also, logic gate 12 can have any number of inputs, and it can contain any number of circuit components. All that matters as far as the invention is concerned is that logic gate 12 contains some components which receive current from a power bus, and that those components are parasitically coupled to the substrate.

Similarly, the exact makeup of the output driver 13 is unimportant. All that matters is that it includes an output transistor L which is parasitically coupled to the substrate and operates to drive a current off of the die as an output signal, and includes a biasing resistor N which is parasitically coupled to the substrate and operates to bias the output transistor L either on or off.

Further, both resistor 50 and resistor 51 can be coupled to receive current from bus 20-3. Such a modification will increase the capacitive coupling of bus 20-3 to the substrate and decrease the resistive coupling. But the modification will also couple both sides of the differential output driver 13 to bus 20-3 and thereby make the bus current essentially constant which in turn will reduce bus noise.

Also, it should be clear that logic gate 12 and output driver 13 can be comprised of field effect transistors (e.g., MOS transistors) rather than bipolar transistors as shown in FIG. 2. For example, the gates disclosed in patent application Ser. No. 277,629 (now U.S. Pat. No. 4,445,051 and assigned to the present assignee) are suitable MOS gates.

Further, it should be evident from the above Detailed Description that the development which is presented in conjunction with FIGS. 7, 8, and 9 approximately holds even when the respective magnitudes of the parasitic components L, M, and N are somewhat changed. Preferably, however, the impedance of the components L is at least five times the impedance of the components M and the impedance of the components N is at least five times the impedance of the components L.

Accordingly, since many such modifications can be made to the above described embodiment, it is to be understood that the invention is not limited to that embodiment's details but is defined by the appended claims.

What is claimed is:

1. A circuit integrated into a substrate and having improved noise immunity, comprising:

a plurality of intercoupled logic gate means that receive input signals, switch currents internally in each gate to perform respective logic functions on their input signals, and produce logic signals with voltage states that indicate the results of the logic functions;

a plurality of output driver means, each of which is coupled to receive at least one of said logic signals; each of said output driver means including a resistor means for passing a small bias current indicating said voltage states of said received logic signals, and a transistor means coupled to said resistor means for passign a large drive current when said bias current indicates said received logic signals are in a particular state;

said logic gate means, resistor means, and transistor means being parasitically coupled together via respective parasitic capacitances and resistances through said substrate; and a first power bus means coupled to said transistor means for supplying said drive current thereto, a second power bus means separate from said first power bus means and coupled to said logic gate means for supplying said currents that switch internally thereto, and a third power bus means separate from said first and second power bus means and coupled to said resistor means for supplying said bias current thereto.

2. A circuit according to claim 1 wherein the parasitic coupling from said third power bus means through said resistor means and said substrate and said logic gate means to said second power bus means is less than one-fifth the parasitic coupling from said first power bus means through said transistor means and said substrate and said logic gate means to said second power bus means.

3. A circuit according to claim 2 wherein said resistor means and said transistor means occupy respective areas of said substrate having a ratio of less than one to five, while said logic gate means and said transistor means occupy respective areas of said substrate having a ratio of at least five to one.

4. A circuit according to claim 3 wherein said transistor means is a bipolar transistor.

5. A circuit according to claim 3 wherein said transistor means is a field effect transistor.

6. A circuit integrated into a substrate and having improved noise immunity, comprising:

logic means parasitically coupled via a first resistance and capacitance to said substrate, for receiving input signals and switching currents internal to the logic means to produce a digital output signal as a logical function of said input signals;

a resistor means parasitically coupled via a second resistance and capacitance to said substrate, for passing a small bias current indicating the magnitude of said output signal;

a transistor means parasitically coupled via a third resistance and capacitance to said substrate, for receiving said bias current and passing a large drive current when said bias current indicates said output signal has a particular magnitude; and first, second, and third power bus means for respectively supplying said drive current to said transistor means, said currents that switch internally to said logic means, and said bias current to said resistor means;

said first, second, and third power bus means being separate from each other but being electrically interactive through said parasitic coupling.

7. A circuit according to claim 6 wherein the parasitic coupling from said third power bus means through said resistor means and said substrate and said logic means to said second power bus means is less than one-fifth the parasitic coupling from said first power bus means through said transistor means and said substrate and said logic means to said second power bus means.

8. A circuit according to claim 6 wherein said resistor means and said transistor means occupy respective areas of said substrate having a ratio of less than one to five, while said logic means and said transistor means occupy respective areas of said substrate having a ratio of at least five to one.

9. A circuit according to claim 6 wherein said transistor means is a bipolar transistor.

10. A circuit according to claim 6 wherein said transistor means is a field effect transistor.

11. A circuit integrated into a substrate and having improved noise immunity, comprising:
a logic means for receiving input signals and for switching current from a first bus to produce a two state logic signal as a function of said input signals;
a resistor means, coupled to said logic means, for receiving and passing a small bias current from a second bus indicating which state said logic signal is in;
a transistor means, coupled to said resistor means, for receiving and passing a large drive current from a third bus in response to said bias current indicating that said logic signal is in a certain one of said two states;
a large parasitic resistance and small parasitic capacitance coupling said first bus serially through said logic means, said substrate, and said resistor means to said second bus; and a relatively small parasitic resistance and large parasitic capacitance coupling said first bus serially through said logic means, said substrate, and said transistor means to said third bus.

* * * * *